(12) United States Patent
Lai

(10) Patent No.: US 8,666,689 B1
(45) Date of Patent: Mar. 4, 2014

(54) PHASE NOISE ANALYSIS OF OSCILLATOR CIRCUIT DESIGNS

(75) Inventor: Xiaolue Lai, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 637 days.

(21) Appl. No.: 12/346,731

(22) Filed: Dec. 30, 2008

(51) Int. Cl.
*G01R 13/00* (2006.01)
*G01R 23/00* (2006.01)
*G06F 17/50* (2006.01)

(52) U.S. Cl.
USPC .................................. 702/70; 331/44; 703/14

(58) Field of Classification Search
USPC ........... 702/70, 57–58, 65–66, 69, 71–73, 75, 702/81, 84–86, 106–107, 109, 111–112, 702/116–117, 123–124, 179, 182–183, 702/189–197; 331/1 R, 16, 18, 23, 25, 34, 331/44, 48; 703/2–4, 13–14
See application file for complete search history.

(56) References Cited

U.S. PATENT DOCUMENTS 6,167,359 A * 12/2000 Demir et al. ................... 702/191
6,529,859 B1 * 3/2003 Demir et al. ................... 702/191

OTHER PUBLICATIONS

Vytyaz, I., Comparison of Time-Domain and Frequency-Domain Phase Noise Analysis, Dec. 16, 2005, Thesis for MS degree, Electrical and Computer Engineering Dept., Oregon State University, 61 pp.*
Demir et al., Computing Phase Noise Eigenfunctions Directly from Stead-State Jacobian Matrices, 2000 IEEE, pp. 283-288.*
Gourary et al., New Numerical Technique for Cyclostationary Noise Analysis of Oscillators, Oct. 2007, Proceedings of the 37th European Microwave Conference, Munich Germany, pp. 1173-1176.*
Lai et al., A Multilevel Technique for Robust and Efficient Extraction of Phase Macromodels of Digitally Controlled Oscillators, Jul. 24-28, 2006, DAC 2006, pp. 1017-1022.*
A. Demir, A. Mehrotra, and J. Roychowdhury. Phase noise in oscillators: a unifying theory and numerical methods for characterization. IEEE Trans. on Circuits and Systems-I: Fundamental Theory and Applications, 47(5):655-674, May 2000, 6 pages.
X. Lai and J. Roychowdhury. Macromodelling Oscillators Using Krylov-Subspace Methods. In ASPDAC 2006, Jan. 2006, 6 pages.
A. Demir. Phase noise in oscillators: Daes and colored noise sources. In IEEE/ACM International Conference on Computer-Aided Design, Nov. 1998, 8 pages.
X. Lai and J. Roychowdhury. Capturing Oscillator Injection Locking via Nonlinear Phase-Domain Macromodels. IEEE Trans. Microwave Theory Tech., 52(9):2251-2261, Sep. 2004, 11 pages.
X. Lai and J. Roychowdhury. TP-PPV: Piecewise Nonlinear, Time-Shifted Oscillator Macromodel Extraction For Fast, Accurate PLL Simulation. In Proceedings of IEEE ICCAD 2006, Nov. 2006, 6 pages.

(Continued)

*Primary Examiner* — Toan Le
(74) *Attorney, Agent, or Firm* — Alford Law Group, Inc.

(57) ABSTRACT

In one embodiment of the invention, a method and a system for phase noise analysis of oscillators is provided using frequency aware perturbation projection vector techniques. The method and system includes performing steady state analysis on the oscillator by generating an augmented Jacobian matrix. A transfer function for frequency deviation is extracted for the augmented Jacobian matrix for a predetermined frequency range including the oscillation frequency of the oscillator. The phase noise is predicted based on the extracted transfer function.

33 Claims, 9 Drawing Sheets

(56) References Cited

OTHER PUBLICATIONS

A. Demir and J. Roychowdhury. A reliable and efficient procedure for oscillator ppv computation, with phase noise macromodelling applications. IEEE Trans. on Computer-Aided Design of Integrated Circuits and Systems, 22(2):188-197, Feb. 2003, 10 pages.

Y. Saad and M. H. Schultz. Gmres: a generalized minimum residual algorithm for solving non-symmetric linear systems. SIAM Journal on Scientific and Statistical Computing, 7:856-869, Sep. 1986, 14 pages.

T. Mei and J. Roychowdhury. Oscillator-AC: Restoring Rigour to Linearized Small Signal Analysis of Oscillators. In ICCAD 2005, Nov. 2005, 6 pages.

\* cited by examiner

PHASE NOISE ANALYSIS OF OSCILLATOR CIRCUIT DESIGNS

FIELD

The embodiments of the invention relate generally to art of oscillator circuits. More particularly, the embodiments of the invention relate to a method and system for phase noise analysis of oscillator circuit designs.

BACKGROUND

Oscillator circuits are commonly used in many electrical systems to generate a repeating waveform at or around an oscillating frequency or fundamental frequency. Oscillator circuits are often used to generate clock signals in digital integrated circuits as a basis to control the timing behavior of other signals.

In oscillator based systems, the oscillator phase uncertainty may severely affect the overall system performance. Phase noise in the oscillator circuit may result in reducing the timing margins in digital systems, and compromising channel separations in communications. Hence, phase noise is a major concern during the oscillator circuit design. Efficient and accurate prediction of oscillator noise is one of the most important functionalities for present simulation and verification tools.

Several phase noise prediction techniques have been suggested for oscillator circuits. Most of these techniques are based on solving for a Perturbation Projection Vector (PPV). The PPV techniques characterize the oscillators' phase response to perturbations.

The PPV-based phase noise prediction techniques predict the oscillator noise correctly for small oscillator circuits. However, as the technology advances, oscillators have become more complex with more devices. These extra devices have made oscillator circuits larger and thus have added time constant (RC delays). The larger oscillator circuits challenge previous noise prediction methods. Large time constants significantly compromise the matrix conditioning of oscillators' linear periodic time-varying (LPTV) systems, making standard PPV noise analysis techniques fail or less accurate.

BRIEF SUMMARY

The embodiments of the invention are best summarized by the claims that follow below.

To improve the phase noise analysis accuracy, we consider perturbation projection vectors (PPV) to have a frequency-dependent quantity. That is, different perturbation frequencies have different PPV waveforms. These frequency-aware perturbation projection vector (FW-PPV) techniques are used to provide accurate noise analysis of oscillator circuit designs.

PPVs for different small signal frequencies are calculated and the time domain impulse response waveforms are constructed there-from. Using the impulse response waveforms in a nonlinear phase equation, FW-PPV predicts the oscillator phase response with greater accuracy. Oscillator frequency is treated as a state variable, like node voltages, so that a periodic AC analysis (PAC) can be applied to calculate the frequency deviation of the oscillator circuit under periodic perturbations. A FW-PPV can be extracted by solving an adjoint system of the oscillator AC analysis. At a small signal frequency (e.g., zero Hertz), a special case, the FW-PPV reduces to the standard PPV.

Using a FW-PPV phase equation, new analytical equations for oscillator noise analysis may be formed. The resulting noise analysis techniques are applicable to any oscillator, particularly oscillator circuits with large time constants, such that phase noise simulations do not overestimate noise effects and the resulting oscillator circuit designs are not overdesigned.

BRIEF DESCRIPTIONS OF THE DRAWINGS

DETAILED DESCRIPTION

In the following detailed description of the embodiments of the invention, numerous specific details are set forth in order to provide a thorough understanding of the embodiments of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

The embodiments of the invention include a method, and system for phase noise analysis of oscillator circuit designs. In this context, phase noise analysis also includes computation of a perturbation projection vector (PPV) as a function of frequency for phase noise analysis. In other words, the reference to phase noise analysis herein includes computation of a frequency aware perturbation projection vector (FW-PPV), although the algorithmic techniques apply equally well to phase noise analysis without frequency considerations.

Oscillator Phase Noise

Figure 1A:
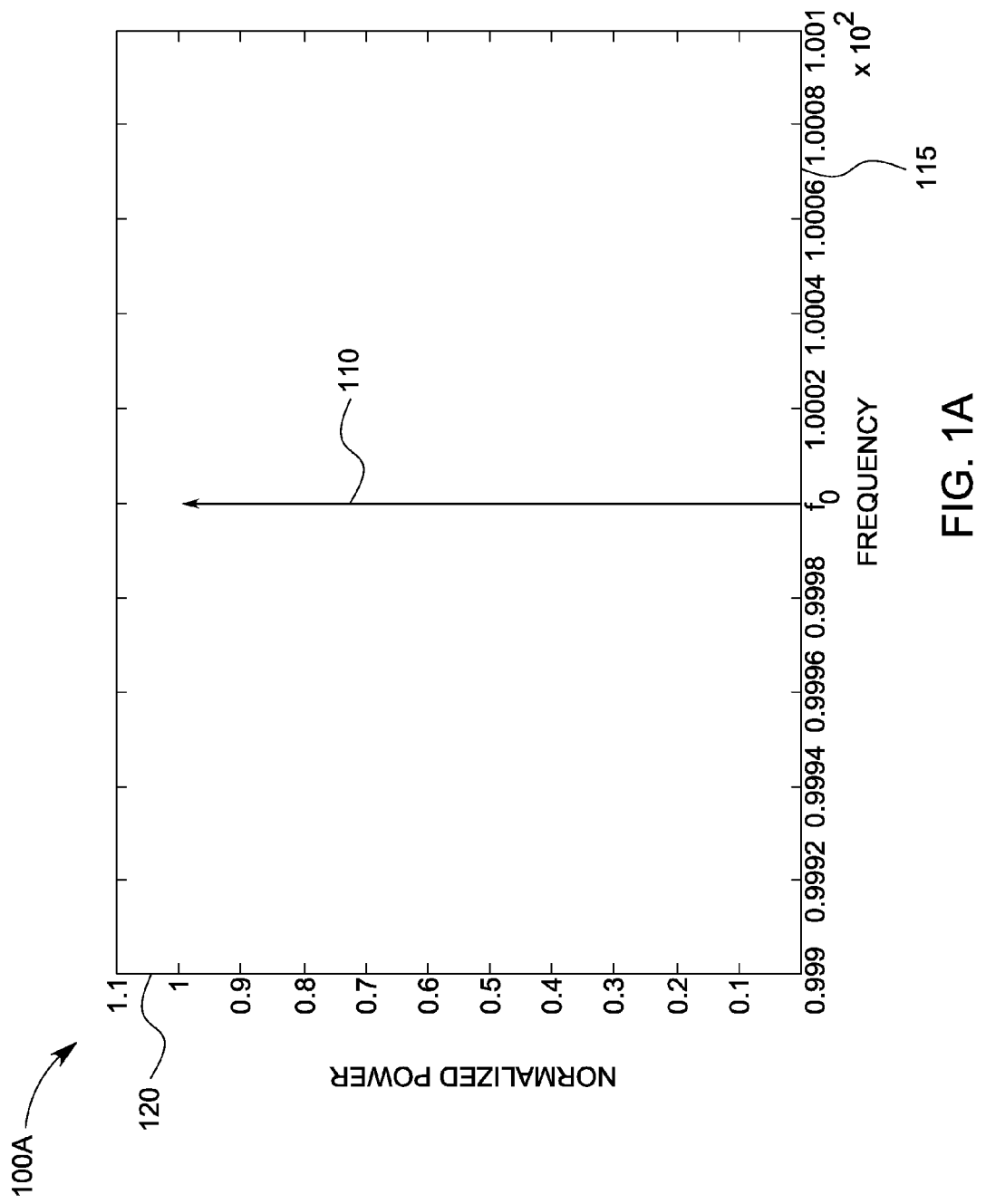
FIG. 1A is a diagram illustrating an exemplary power spectral density plot of an ideal oscillator.

Referring now to FIG. 1A, an exemplary plot 100A for an ideal oscillator is illustrated. Plot 100A represents frequency 115 along the x-axis and normalized power 120 along the y-axis. Normalized power 120 represents the power of the oscillator signal at any given frequency divided by the total power of the oscillator signal.

An ideal oscillator would generate purely sinusoid waveforms. In the frequency domain, the waveforms of an ideal oscillator can be represented as a single pulse at the oscillator's fundamental frequency. FIG. 1A illustrates a pulse signal 110 generated by an ideal oscillator at the fundamental frequency $f_0$. As illustrated, for an ideal oscillator, the normalized power at the fundamental frequency $f_0$ is unity and the power at all other adjacent frequencies is zero. In practice, however, an ideal oscillator having the plot 100A is not achievable due to noise from various sources (e.g., thermal noise in resistors).

Real oscillators cannot focus all signal power at a single frequency such as shown in FIG. 1A. Instead, the power spreads to adjacent frequencies about the fundamental frequency thereby resulting in phase noise.

Figure 1B:
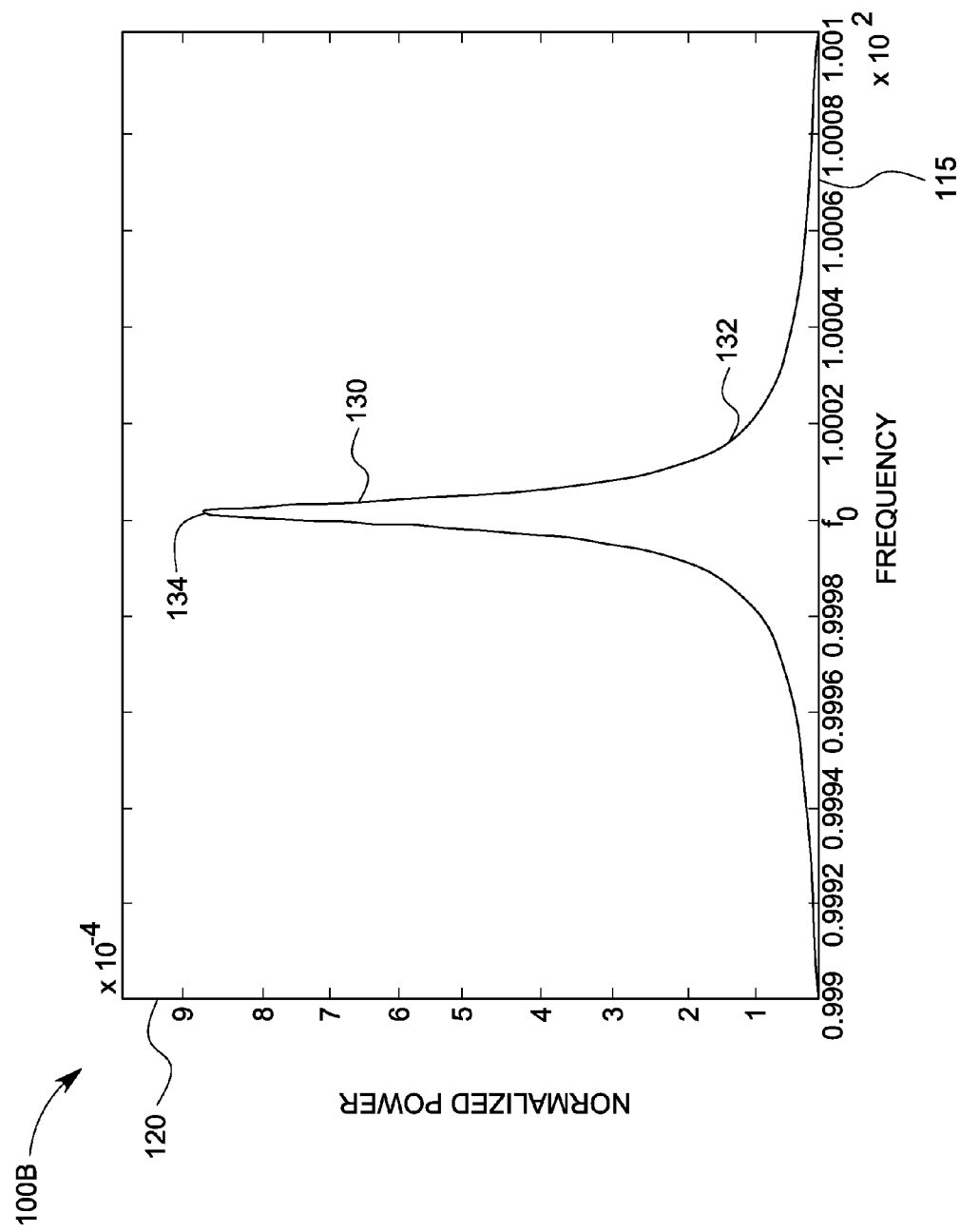
FIG. 1B is a diagram illustrating an exemplary power spectral density plot generated during the phase noise analysis of an oscillator that is analyzed by the embodiments of the invention.

Referring now to FIG. 1B, an exemplary plot 100B for a conventional oscillator is illustrated. In a conventional oscillator, the power of the oscillator signal 130 is spread to adjacent frequencies around the fundamental frequency $f_0$ due to the device noise present in the oscillator. Plot 100B illustrates reduced normalized power 134 at the fundamental frequency $f_0$ and non-zero power component value 132 at adjacent frequencies. The non-zero power component values at adjacent frequencies, such as non-zero power component value 132 for example, represent the phase noise in an oscillator.

Phase noise is the frequency domain representation of random fluctuations in the oscillator phase. Oscillator phase noise has been shown to have a Lorentzian spectrum L(f) function (a Lorentzian function is the singly peaked function) which can be computed from the following equation:

$$L(f) = \frac{f_0^2 c}{(\pi f_0^2 c)^2 + f^2},$$

where $f_0$ is the oscillator's fundamental frequency, f is the offset frequency from the fundamental frequency, and c is a scalar constant. The Lorentzian corner frequency $f_c$ is defined by the following equation:

$$f_c = \pi f_0^2 c.$$

Figure 1C:
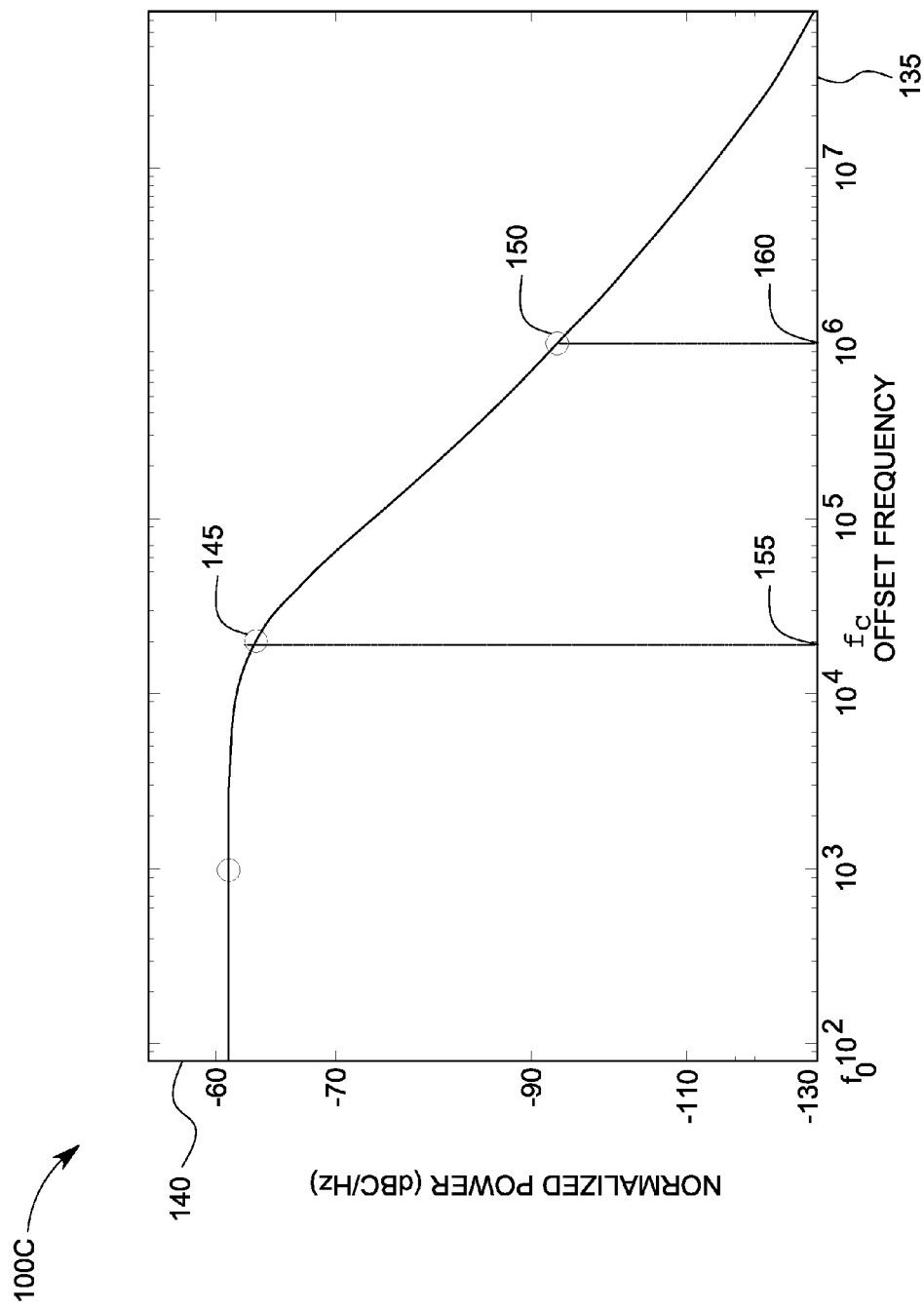
FIG. 1C is a diagram illustrating an exemplary Lorentzian plot generated during the phase noise analysis of an oscillator that was analyzed by the embodiments of the invention.

FIG. 1C is a diagram illustrating an exemplary Lorentzian plot 100C generated during the phase noise analysis of an oscillator. Many phase noise analysis tools provide an option for a logarithmic plot for phase noise of an oscillator. The phase noise 140 along the y-axis and the offset frequency 135 along the x-axis are represented on a logarithmic scale. Phase noise 140 is given in decibels per Hertz (dBc/Hz) (or volts per square-root of Hertz V/sqrt (Hz) in linear scale) by dividing the signal power by the fundamental frequency $f_0$ and the offset frequency is given in Hertz (Hz).

Furthermore, plot 100C illustrates a phase noise plot with the fundamental frequency $f_0$ as origin. Hence, plot 100C illustrates phase noise as a function of offset frequency from the fundamental frequency $f_0$. For example, points 145 and 150 along the plot 100C represent phase noise values at offset frequencies 155 and 160 respectively.

Plots 100A, 100B, and 100C of FIGS. 1A, 1B, and 1C respectively are shown for illustrative purposes only as several other variants may exist to illustrate phase noise performance of an oscillator. Furthermore, the method and system in accordance with the embodiments of the invention may be used to generate any of these plots or their variants.

Perturbation Projection Vector and Oscillator Phase Noise Analysis

One of the commonly used techniques for oscillator phase noise analysis is based on a perturbation projection vector (PPV). A brief description of conventional PPV-based techniques is included herein as a reference to support the embodiments of the invention.

In PPV-based techniques, a perturbed oscillator can be expressed as a differential algebraic equation (DAE) as follows:

$$\dot{q}(x(t)) + f(x(t)) = b(t)$$

where b(t) is the perturbation applied to the oscillator, x(t) are the variables in the circuit such as node voltages or path currents, and $\dot{q}(x(t))$ and $f(x(t))$ are functions of x(t).

The solution of the perturbed oscillator can be expressed in equation form as:

$$x_p(t) = x^*(t + \alpha(t)) + y(t)$$

where $x_p(t)$ is the perturbed solution, $x^*(t)$ is the steady-state solution, $\alpha(t)$ is the phase shift due to the perturbation b(t), and y(t) is the amplitude variation due to the perturbation b(t).

From the equation for the perturbed solution, the total deviation x(t) can be expressed as $$x(t) = p(t) + y(t)$$

where $p(t) = x^*(t + \alpha(t)) - x^*(t)$ is the orbit deviation due to phase shift $\alpha(t)$, which is governed by the scalar differential equation described below.

A PPV-based phase noise analysis tool estimates the phase noise by solving a unified phase equation. The phase deviation $\alpha(t)$ in an oscillator circuit due to the perturbation/noise is governed by a scalar differential equation as follows:

$$\dot{\alpha}(t) = v_1^T(t + \alpha(t)) \cdot b(t)$$

where $\dot{\alpha}(t)$ is the derivative of the phase shift $\alpha(t)$ and $v_1(t)$ is the perturbation projection vector (PPV). The perturbation projection vector is a vector of periodic waveforms with the same period as that of the free-running oscillator circuit.

In the Lorentzian Spectrum, the orbit deviation due to phase shift p(t) is considered to be the major contributor of oscillator noise, such that the amplitude variation y(t) can be ignored. As a result, oscillator noise may be approximated using the following equation $$x(t) = p(t) = x^*(t + \alpha(t)) - x^*(t).$$

Since the orbit deviation p(t) can be easy calculated after the phase shift $\alpha(t)$ is solved using the scalar differential equation, the typical PPV technique (unified PPV) offers an efficient way for predicting oscillator noise. However, if the time constant of the circuit is large or the small signal frequencies are high, the unified PPV can become inaccurate and overestimate predictions of oscillator noise.

PPV Extraction

For robustness, most PPV-based techniques solve for PPV by using harmonic balance techniques. For phase noise analysis of oscillators, the frequency is an extra unknown in the harmonic balance simulation.

When harmonic balance converges, a Jacobian matrix (A Jacobian matrix is a matrix with entries of all first-order partial derivatives of a vector-valued function), which is referred to as an augmented Jacobian matrix, has the form of $$J_{aug} = \begin{pmatrix} J & q \\ p^T & r \end{pmatrix},$$

where J is the harmonic balance Jacobian of the oscillator equation, p is the vector of phase condition, $q=\Omega Q$ is the Fourier coefficient of $\dot{q}(x^*(t))$, and r is a scalar.

Thus, a linear set of equation is formed from an augmented Jacobian matrix $J_{aug}$. The matrix $J_{aug}$ includes additional elements to compute the frequency deviation.

If the augmented Jacobian matrix $J_{aug}$ is not singular, the PPV can be calculated by solving the following linear equation:

$$J_{aug}^T X = e$$

where $e=[0,0,\ldots,0,1]^T$, and $X=[V_1,d]^T$. $V_1$ is a vector with the Fourier coefficients of the PPV, and d is a scalar. Note that the superscript T indicates transpose conjugate.

Oscillator Phase Noise Prediction

Subsequently, the computed PPV, a steady state solution for the oscillator, and the estimated noise values at each node of the oscillator may be used to find the phase noise in the oscillator circuit.

For instance, in one of the conventional PPV techniques, the phase noise uses a Lorentzian function. The Lorentzian function uses a scalar value, known as the jitter factor $c_w$, as a parameter. For instance, the phase noise S(f) for an oscillator circuit with white noise sources is computed by the equation as follows:

$$S(f) = \sum_{i=-N}^{N} X_i X_i^* \frac{f_0^2 i^2 c_w}{\pi^2 f_0^4 i^4 c_w^2 + (f + if_0)^2}$$

where $X_i$ is the Fourier coefficient of the oscillator output at harmonic index i, $f_0$ is the fundamental frequency, and f is the small signal/the desired offset frequency. The $c_w$ term in the equation is a white noise jitter factor. The white noise jitter factor $c_w$ is given by the following equation:

$$c_w = \frac{1}{T}\int_0^T v_1^T(t) v_1(t) dt$$

In the phase noise equation and the white noise jitter factor equation, $v_1(t)$ is the unified PPV, $X_i$ is the Fourier coefficient of the oscillator output at an harmonic index i, $f_0$ is the fundamental frequency, and f is the small signal frequency. To use these two equations, all noise sources need to be white noise with a power spectral density of one.

When the noise sources are colored noise, the analytical equation to determine phase noise S(f) is as follows:

$$S(f) = \sum_{i=-N}^{N} X_i X_i^* S_i(f+if_0)$$

where $$S_i(f) = \frac{f_0^2 i^2 \sum_{k=1}^{n}|V_{0_k}|^2 S_{N_k}(f)}{\pi^2 f_0^4 i^4 \left(\sum_{k=1}^{n}|V_{0_k}|^2 S_{N_k}(f)\right)^2 + f^2}$$

In this equation, $V_{0k}$ is the DC Fourier coefficient of the PPV of the node k, and $S_{Nk}$ is the power spectral density (PSD) of all colored noise sources applied to the node k.

If circuits have both white and colored noise source, the PSD phase noise equation S(f) may be written as $$S_i(f) = \frac{f_0^2 i^2 \left(\sum_{k=1}^{n}|V_{0_k}|^2 S_{N_k}(f) + c_w\right)}{\pi^2 f_0^4 i^4 \left(\sum_{k=1}^{n}|V_{0_k}|^2 S_{N_k}(f) + c_w\right)^2 + f^2}$$

where the jitter factor equation $c_w$ is defined previously. The combined equation for white and colored noise works well on small and fast oscillators; however, when oscillators have many slow time constants, the equation may over-estimate the phase noise.

A problem with the conventional PPV-based phase noise analysis techniques arises because the PPV waveforms are used to capture the phase response of oscillators under any perturbation, regardless of the perturbation frequency. That is, it is not frequency aware.

Note that the phase deviation derivative $\dot{\alpha}(t)$ also gives the frequency deviation $\Delta\omega(t)$ for the oscillator. Thus, the frequency deviation for an oscillator is given by the scalar differential equation as follows:

$$\Delta\omega(t) = v_1^T(t+\alpha(t)) \cdot b(t)$$

In this case, the PPV techniques estimate the impulse response of oscillator frequency deviation in the time domain as a pulse with the magnitude of the PPV, and therefore the transfer function of the frequency deviation in the frequency domain is a constant, independent of small signal frequency. This approximation may be problematic, especially for slow oscillators with large RC delays, because the oscillator frequency, like voltages and currents in the circuit, cannot change infinitely fast as a physical system has limited bandwidth.

In oscillator noise analysis, the phase noise is calculated for the total noise contributed by all devices in the circuit. The slow nodes in the oscillator may invalidate the PPV phase equation, because the impulse response can no longer be approximated using a pulse. The slow nodes filter out the noise from nearby devices and reduce the total noise. As a result, the PPV-based phase noise analysis tools overestimate the total noise because the filtering effects of the circuit are ignored.

Frequency-Aware PPV Techniques

Generally, the embodiments of the invention describe the FW-PPV as a transfer function of the frequency deviation. However in the frequency domain, the transfer function of the frequency deviation in this case with FW-PPV techniques is not a constant—it is frequency-dependent. The estimated transfer function accurately represents the physical system with a limited bandwidth.

For FW-PPV, a general phase equation is derived which takes the perturbation frequency into consideration. Then a method to calculate the frequency-aware PPV is described. Finally FW-PPV based analytical equations are provided for predicting oscillator phase noise.

Figure 6:
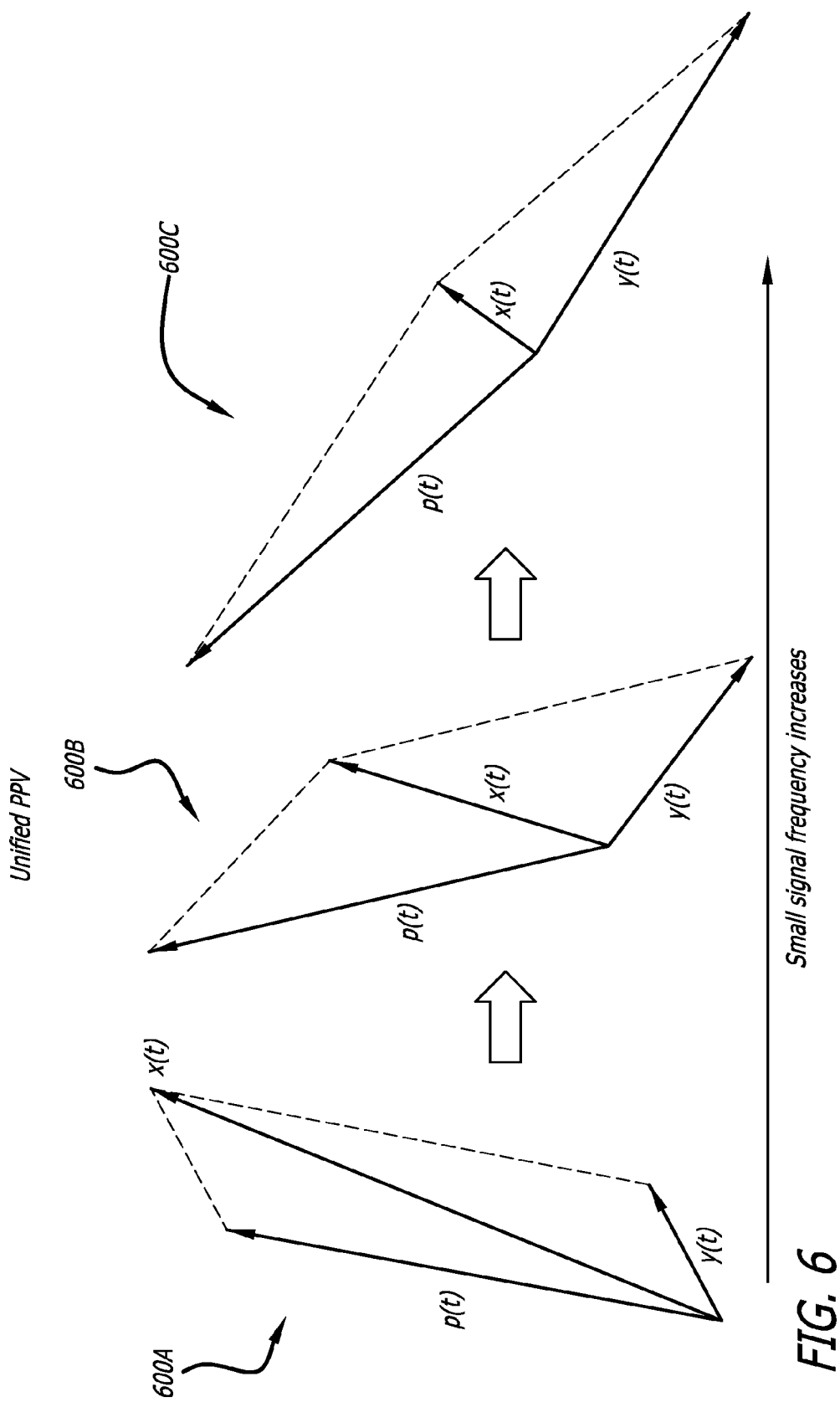
FIG. 6 illustrates a graph of total deviation vectors for an oscillator circuit and its component parts over increasing small signal frequencies to illustrate the problem of using standard perturbation projection vector (PPV) techniques as it uses the same unified perturbation projection vector to analyze noise for different small signal frequencies.
Figure 7:
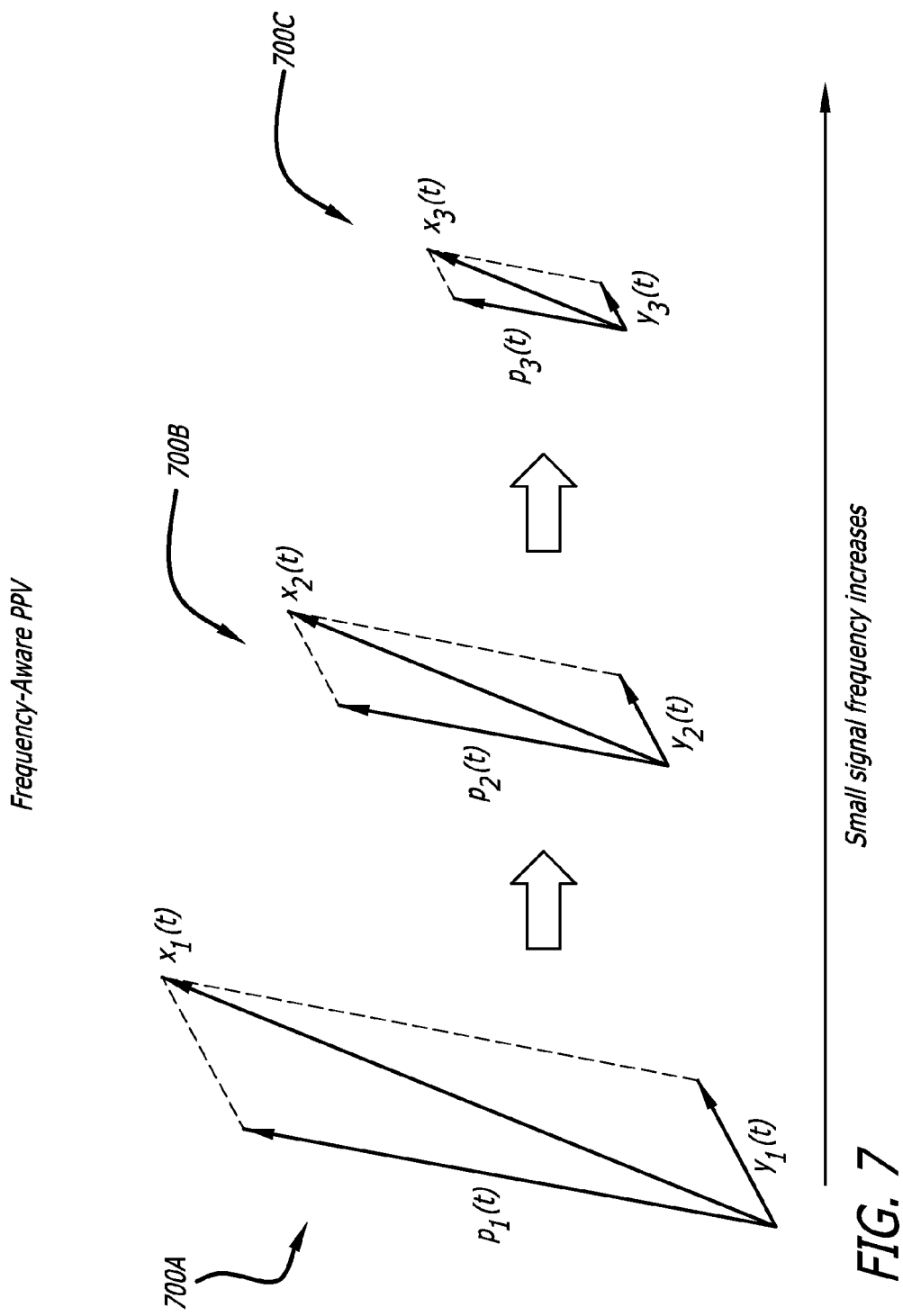
FIG. 7 illustrates a graph of total deviation vectors for an oscillator circuit and its component parts over increasing small signal frequencies and the use of using frequency aware perturbation projection vector (FW-PPV) techniques to analyze noise as it generates different PPV vectors for different small signal frequencies.

FIGS. 6 and 7 illustrate graphs of vectors that may be used to compare a unified-PPV technique and a frequency aware-PPV technique for predicting oscillator phase noise. The total deviation vector x(t) can be decomposed into two parts: p(t), the orbit deviation due to phase shift, and y(t), the deviation due to amplitude variations.

FIG. 6 illustrates various decompositions 600A-600C of the total deviation vector x(t) using a unified PPV. For a lower small signal frequencies (the offset frequency is inside the bandwidth of the oscillator), the orbit deviation due to phase shift p(t) dominates in the decomposition plot such as shown by the decomposition 600A shown in FIG. 6 with a small deviation y(t) due to amplitude variations. In this case, it is valid to use p(t) to approximate the total noise x(t).

However, when the small signal frequencies increases (the offset frequency starts to be outside of the bandwidth), the total noise of the oscillator decreases significantly. If we still use the unified PPV to do the decomposition, the small deviation will be decomposed into two large components such as shown by the decomposition 600C shown in FIG. 6. That is, the total deviation x(t) is decomposed into two large components of orbit deviation due to phase shift p(t) and deviation y(t) due to amplitude variations. In this case, the unified-PPV technique of oscillator noise analysis will over-estimate the phase noise of the oscillator if we still use the orbit deviation p(t), which is easy to calculate, to approximate the oscillator noise x(t). Hence, the unified PPV has problem when the small frequency is outside of the bandwidth of the oscillator, and the problem becomes severe when the oscillator is large and with many large RC time constants (the oscillator has very limited bandwidth).

FIG. 7 illustrates various decompositions 700A-700C of the total deviation vectors $x_1(t)$, $x_2(t)$, and $x_3(t)$, respectively, using a frequency-aware PPV analysis for the same oscillator circuit.

At a first lower small signal frequency, the first total deviation vector Mt) is decomposed into a first orbit deviation Mt) due to phase shift and a first amplitude deviation Mt) due to amplitude variations. At the first lower small signal frequency, the decomposition 700A in FIG. 7 is similar to that of the decomposition 600A of FIG. 6.

However, as the small signal frequency increases, the decompositions 700B and 700C for an FW-PPV differ significantly from the decompositions 600B and 600C for a unified-PPV. When the offset frequency is high, or the offset frequency is out side of the bandwidth of the oscillator, the unified-PPV will decompose the total deviation into two large parts. The reason is that when the offset frequency is out side of the oscillator bandwidth, the oscillator should have a small noise component. However, the unified-PPV always uses the same (large) PPV vector (unified-PPV vector) to do the decomposition, resulting in a decomposition that is ill-conditioned (large phase and amplitude components).

If we use a FW-PPV, we have different PPV vectors for different offset frequencies. When the offset frequency is high, a smaller PPV vector is used to decompose resulting in decomposing a smaller total noise component into smaller phase and amplitude components. If the offset frequency is very high, the total noise is very small, a very small PPV vector is used to perform the decomposition resulting in the total noise being decomposed into a very small phase and amplitude components.

The decomposition 700B in FIG. 7 decomposes a second total deviation vector $x_2(t)$ into a second orbit deviation $p_2(t)$ due to phase shift and a second amplitude deviation $y_2(t)$ due to amplitude variations. The second orbit deviation $p_2(t)$ and the second amplitude deviation $y_2(t)$ differ significantly from that of the decomposition 600B at the same small signal frequency—$p_2(t)$ is still a good approximation of $x_2(t)$, and $y_2(t)$ is small.

The decomposition 700C in FIG. 7 decomposes a third total deviation vector $x_3(t)$ into a third orbit deviation $p_3(t)$ due to phase shift and a third amplitude deviation $y_3(t)$ due to amplitude variations. The third orbit deviation $p_3(t)$ and the third amplitude deviation $y_3(t)$ differ significantly from that of the decomposition 600C at the same small signal frequency—$p_3(t)$ is a good approximation of $x_3(t)$, and $y_3(t)$ is very small.

In FIG. 7, when the total deviation x(t) decreases as the small signal frequency increases, the orbit deviation p(t) and the amplitude deviation y(t) decrease as well, using the FW-PPV technique. In contrast with unified-PPV techniques, as the small signal frequency increased the orbit deviation p(t) and the amplitude deviation y(t) didn't decrease.

Using the FW-PPV technique, the deviation x(t) will be decomposed into two small components—there is no ill-conditioned decomposition, such as the ill-conditioned decompositions shown in FIG. 6, for example. The amplitude variation y(t) is always very small, and the orbit deviation p(t) due to phase shift is always very close to the total deviation x(t). Hence with FW-PPV techniques, we can use the orbit deviation p(t), which is very easy to calculate using the PPV technique, to approximate the total noise of the oscillator. The accuracy of phase noise analysis using unified PPV techniques can rapidly degrade when oscillator circuits and their time constants become larger or small signal frequency increases significantly. However, the FW-PPV technique doesn't have this problem.

Frequency-Aware Nonlinear Phase Equation

Since a unified PPV has problem when circuits have large time constants, a more general phase equation is derived.

The relation between phase deviation and frequency deviation can be expressed by an implicit differential equation as follows:

$$\dot{\alpha}(t) = \Delta\bar{\omega}(t + \alpha(t)),$$

where $\Delta\bar{\omega}$ is the normalized frequency deviation that has the form of $$\Delta\bar{\omega} = \frac{\Delta\omega}{\omega_0}.$$

If there is a way to compute the normalized frequency deviation $\Delta\bar{\omega}$, the phase deviation can calculated by solving the implicit differential equation for $\alpha(t)$.

Oscillators are special circuits. Their frequencies are treated as a state variable, like node voltages, in simulations. Oscillator frequency changes when perturbations are applied. Hence, there should have impulse responses of oscillator frequency deviation due to perturbations. Since the linearized oscillator system is an LPTV system, the impulse responses should have the form of the equation:

$$h_{\Delta\bar{\omega}}(\tau, t),$$

which gives us the frequency deviation at time t after an impulse is applied at time τ.

Assuming we have the frequency deviation impulse response $h_{\Delta\bar{\omega}}(\tau,t)$, the oscillator frequency deviation can be calculated using the following convolution equation:

$$\Delta\bar{\omega}(t) = \int_0^t h_{\Delta\bar{\omega}}^T(\tau, t) \cdot b(\tau) d\tau$$

where $h_{\Delta\bar{\omega}}$ is a vector in which each entry is an impulse response of frequency deviation to one input, and $b(\tau)$ is a vector of perturbation applied to the oscillator.

Substituting the equation for oscillator frequency deviation $\Delta\bar{\omega}(t)$ into the implicit differential equation for $\alpha(t)$, we obtain a general phase equation for oscillator phase deviation as follows:

$$\dot{\alpha}(t) = \int_0^{(t+\alpha(t))} h_{\Delta\bar{\omega}}^T(\tau+\alpha(\tau), t+\alpha(t)) \cdot b(\tau) d\tau$$

which can be directly solved using a differential equation (DAE) solver (e.g., BE, GEAR).

If we assume the oscillator's frequency response is infinitely fast, then the frequency deviation impulse response $h_{\Delta\bar{\omega}}(\tau,t)$ should have the form of $$h_{\Delta\bar{\omega}}(\tau,t) = v_1(t)\delta(t-\tau).$$

This simplified equation for the frequency deviation impulse response $h_{\Delta\bar{\omega}}(\tau,t)$ may be substituted into the general phase equation for oscillator phase deviation to obtain the original unified PPV equation of:

$$\dot{\alpha}(t) = v_1^T(t+\alpha(t)) \cdot b(t),$$

Hence, the original unified PPV macro-model for the oscillator circuit is a special case of the general phase equation for oscillator phase deviation, which assumes the oscillator frequency response is infinitely fast.

It is difficult to calculate the frequency deviation impulse response $h_{\Delta\bar{\omega}}(\tau,t)$ in the time domain. However, its Fourier series in the frequency domain, $H_{\Delta\bar{\omega}}(\omega_s)$, can be readily calculated using the method described below in the following FW-PPV phase noise analysis.

FW-PPV Oscillator Phase Noise Analysis

Figure 2:
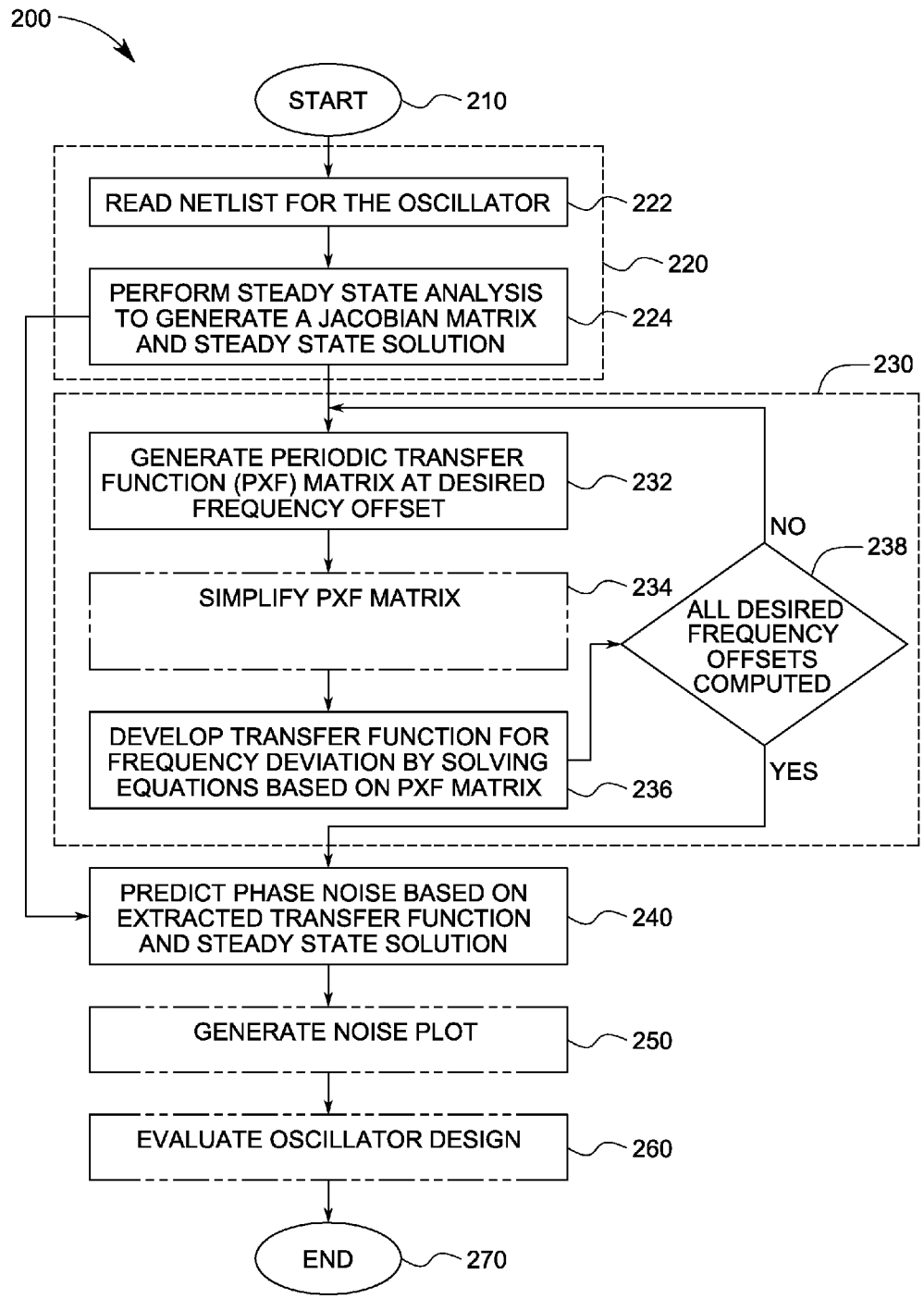
FIG. 2 is a flow chart of a method performed in accordance with some embodiments of the invention.

Referring now to FIG. 2, a method 200 for phase noise analysis in accordance with the embodiments of the invention is illustrated. Generally, the method 200 is initialized at process 210. The process of initialization is then followed by an overall process 220 where a steady state analysis of an oscillator circuit is performed.

Processes 222 and 224 of method 200 illustrate the process of performing steady state analysis. Process 222 includes reading a netlist of an oscillator circuit design. The netlist includes the circuit description for the oscillator circuit design. The netlist may also include cell and library information. Furthermore, the netlist may be in a number of different file formats, including a SPICE file format for transistor level circuit simulations. Process 224 includes generating a set of nonlinear equations for the oscillator from the netlist, solving the nonlinear equation using a harmonic balance for the steady state solution, and subsequently forming an augmented Jacobian matrix from the steady state solution. Thus, a Jacobian matrix and a steady state solution are generated during the steady state analysis of the oscillator circuit design.

The method 200 continues with process 230 by extracting a transfer function for frequency deviation at each node in the netlist of the oscillator circuit design in response to a perturbation applied to each node. The transfer function is extracted for a predetermined frequency range. The predetermined frequency range may be set based on the characteristics of the oscillator circuit and the design requirements.

The processes 232, 234, and 236 of method 200 illustrate extracting the transfer function. In process 232, the oscillator equations are linearized on the steady state solution to generate the periodic transfer function (PXF) matrix based on an augmented Jacobian matrix and a desired frequency offset (i.e. small signal frequency) from the oscillation frequency.

The PAC analysis is described briefly as a reference. Assume we apply harmonic balance to a nonlinear system defined by the equation $$\dot{q}(x(t))+f(x(t))=b(t)$$

and get the steady state solution and the steady state Jacobian matrix by the equation $$J=\Omega C+G,$$

where C is a circulant matrix for the dynamic part of and G is a circulant matrix for the static part of the harmonically balanced non-linear system equation above. In a circulant matrix, every row of the matrix is a right cyclic shift of the row above it.

Generally, for a linear periodic time varying (LPTV) system, such as an oscillator, the PAC analysis includes solving the following equation:

$$(J+j\omega_s C) \cdot X(\omega_s)=b$$

where $\omega_s$ is the small signal frequency, $X(\omega_s)$ is small signal outputs due to small signal inputs b.

For a system where gain of a particular output node is of interest in response to a plurality of inputs, an adjoint system of the periodic AC analysis can be solved by the following equation:

$$(J+j\omega_s C)^T \cdot H(\omega_s)=c$$

where $H(\omega_s)$ is the transfer function at the desired offset/small signal frequency $\omega_s$ for the desired output node defined in vector c. One of the entries in vector c is 1, defining the output node of interest. Note that the superscript T indicates transpose conjugate. The foregoing equation may be used to solve transfer functions for all nodes of the oscillator circuit and thus is referred to as a periodic transfer function analysis (PXF).

FW-PPV Extraction

For the phase noise analysis in accordance with embodiments of the invention, the oscillator frequency is treated as a state variable, and a periodic AC analysis for an oscillator may be performed by solving the following equation:

$$\left(j\omega_s \begin{bmatrix} C & 0 \\ 0 & 0 \end{bmatrix} + \begin{bmatrix} J & T_{\Omega Q} \\ \Omega T_{e_1^T} & T_{x_1^*} \end{bmatrix}\right) \begin{pmatrix} \Delta X(\omega_s) \\ \Delta \bar{W}(\omega_s) \end{pmatrix} = B.$$

In this equation, $J=\Omega C+G$, is the Jacobian matrix of the oscillator equations, C is the circulant matrix of the dynamic part of the circuit equation, and $\omega_s$ is the small signal frequency. $T_{\Omega Q}$ is a Toeplitz matrix (A Toeplitz matrix is a diagonal-constant matrix in which each descending diagonal from left to right is constant.) that circulates $\Omega Q$ (the Fourier coefficient of $\dot{q}(x^*(t))$), and $\Omega T_{e_1}{}^T$ and $T_{x_1}{}^*$ the phase equations for the oscillator. These phase equations are added to make the matrix square and to make the overall system square.

$\Delta W(\omega_s)$ represents the frequency deviation under perturbation B with small signal frequency $\omega_s$. Solving the foregoing equation provides the transfer function of the oscillator's frequency variation for one circuit node. To obtain the periodic transfer functions for all nodes of the circuit, we can use an adjoint system equation. Using the adjoint system, the periodic transfer functions (PXF) analysis of the oscillator circuit design can be represented by the following equation:

$$\left(j\omega_s \begin{bmatrix} C & 0 \\ 0 & 0 \end{bmatrix} + \begin{bmatrix} J & T_{\Omega Q} \\ \Omega T_{e_l^T} & T_{\dot{x}_l^*} \end{bmatrix}\right)^T \begin{pmatrix} H_{\Delta\bar{\omega}}(\omega_s) \\ P \end{pmatrix} = \begin{pmatrix} 0 \\ C \end{pmatrix}$$

The overall system matrix generated for the adjoint method described above is the PXF matrix of process 232 where vector $C=[0, \ldots, 0,1,0, \ldots, 0]^T$. $H_{\Delta\bar{\omega}}(\omega_s)$ represents the transfer functions of frequency deviation for all input nodes at offset/small signal frequency (perturbation frequency) $\omega_s$. We can sweep $\omega_s$ to calculate the transfer functions $H_{\Delta\bar{\omega}}(\omega_s)$ at different small signal frequencies and do a 2D inverse Fourier transform to get the frequency deviation impulse response $h_{\Delta\bar{\omega}}(\tau,t)$ in the time domain for calculating the general phase equation of oscillator phase deviation and the oscillator frequency deviation. Thus, process 232 generates the PXF matrix by using the augmented Jacobian matrix for the offset frequency $\omega_s$.

At process 234, the PXF matrix may be simplified. Note that the Toeplitz matrix $T_{\Omega Q}$ has N columns, where N is the total harmonic number. The PXF system is not easy to solve due to the N additional rows and columns from the phase equation P; however, if we are only interested in the transfer functions when the small signal frequency $\omega_s$ is close to DC (this is the case for phase noise analysis), we can drop all AC columns in $T_{\Omega Q}$ and only keep the middle column, which is $\Omega Q$, resulting in a simplified equation that follows below.

At the desired offset frequency close to the oscillation frequency, the Toeplitz matrix $T_{\Omega Q}$ can be approximated by $\Omega Q$. Thus, the adjoint system matrix equation is simplified to:

$$\left(j\omega_s \begin{bmatrix} C & 0 \\ 0 & 0 \end{bmatrix} + \begin{bmatrix} J & \Omega Q \\ p^T & r \end{bmatrix}\right)^T \begin{pmatrix} H_{\Delta\bar{\omega}}(\omega_s) \\ P \end{pmatrix} = \begin{pmatrix} 0 \\ 1 \end{pmatrix}$$

where $\Omega Q$ and $p^T$ are vectors, r is a scalar, and where $p^T$ represents a single phase equation. Thus, the PXF matrix is simplified. The simplified PXF may be used in the subsequent process 236 for developing the transfer function at the desired offset frequency close to the oscillation frequency.

The simplified adjoint system matrix equation can be singular when the perturbation frequency $\omega_s$ is set to be a whole number of the fundamental frequency $\omega_0$, that is $\omega_s=i\omega_0$, where the index i is a whole number that is not set to zero. If we are interested in the transfer function close to $i\omega_0$, an AC column of the Toeplitz matrix $T_{\Omega Q}$ is added to replace $\Omega Q$ in the simplified adjoint system matrix equation. Since an AC column of the Toeplitz matrix $T_{\Omega Q}$ is just a harmonic shifted version of $\Omega Q$, this replacement may be referred to as a "harmonic shift" technique.

Next, at process 236, developing a transfer function for frequency deviation may be developed by solving a linear system of equations based on the PXF matrix or simplified PXF matrix. As illustrated the adjoint system equation, the linear system of equations is constituted as a function of the periodic transfer function matrix and the transfer function at each node. Thus, the transfer function of frequency deviation, the frequency-aware PPV, is extracted at the desired offset frequency $\omega_s$.

In accordance with some embodiments of the invention, the process 230 of extracting the transfer functions may further include an optional process 238 of repeating the processes 232 through 236 for a plurality of desired frequency offsets within the predetermined frequency range. By repeating these processes, the phase noise at several offset frequency points within the predetermined frequency range may be predicted.

Phase Noise Prediction Using FW-PPV

In process 240, the phase noise of the oscillator is predicted based on the extracted transfer function. Process 240 includes generating a frequency dependent scalar function c(f), known as jitter factor, in response to the extracted transfer function. In the exemplary embodiment, the jitter factor c(f) at the desired offset frequency f is computed by the following equation:

$$c(f) = \sum_{i=1}^{n} \sum_{k=-N}^{N} |H_{\Delta\bar{\omega}_{i,k}}(f)|^2 S_{n_i}(-kf_0 + f)$$

where i is the oscillator circuit node index, k is the harmonic index, $H_{\Delta\bar{\omega}_{i,k}}(f)$ is the extracted frequency deviation transfer function for the $i^{th}$ node on the $k^{th}$ harmonic of the oscillation frequency, and $S_{n_i}$ is the noise power spectral density (PSD) of all noise applied to node i.

With the jitter factor c(f) computed, the phase noise may be computed using one of the Lorentzian functions. The Lorentzian function may be computed using value of the frequency dependent scalar function at the desired frequency offset, steady state solution x*(t) obtained from the steady state analysis and desired frequency offset. In the exemplary embodiment, the phase noise is computed from the following equation for noise power spectral density:

$$S(f) = \sum_{i=-N}^{N} X_i X_i^* \frac{f_0^2 i^2 \cdot c(f + if_0)}{\pi^2 f_0^4 i^4 \cdot c(f + if_0)^2 + (f + if_0)^2}$$

where $X_i$ is the Fourier coefficient of the oscillator output at node index i, $f_0$ is the fundamental frequency, and f is the small signal/desired offset frequency. These two equations for jitter factor c(f) and noise power spectral density S(f) are general forms for performing oscillator phase noise analysis with FW-PPV techniques. After extracting the frequency deviation transfer function $H_{\Delta\bar{\omega}_{i,k}}(f)$ or $H_{\Delta\bar{\omega}}(\omega_s)$ as described previously, the oscillator phase noise can be predicted using these two equations for jitter factor c(f) and noise power spectral density S(f).

Optionally, in accordance with some embodiments of the invention, the predicted phase noise values may be used to generate a plot similar to the plots in process 250. In accordance with some of the embodiments, the plot may be a Lorentzian plot. In accordance with other embodiment, the plot may be generated on a linear scale or any variant thereof.

Furthermore, in accordance with some other embodiments, the predicted phase noise values may be used to evaluate the oscillator circuits in process 260. The performance of the oscillator circuit design may be evaluated at the simulation/verification stage of design process to avoid significant cost.

Thus, method 200 describes a method for phase noise analysis in accordance with some of the embodiments of the invention. In accordance with other embodiments, the processes 210 through 240 of method 200 and their variants may also be used to simply describe a method for generating a frequency dependent PPV for phase noise analysis.

Oscillator Phase Noise Analysis System

Figure 3:
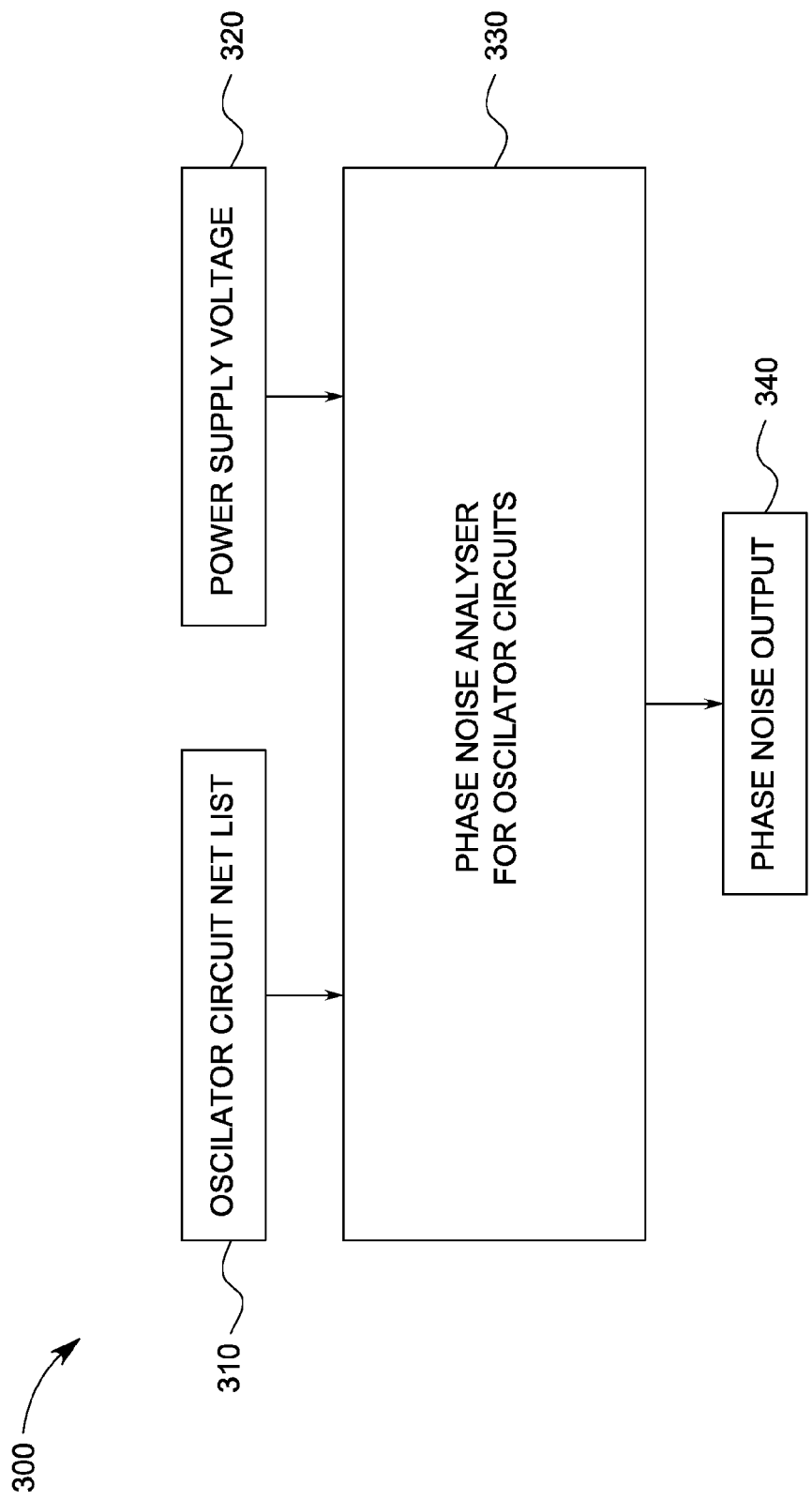
FIG. 3 is a block diagram illustrating information coupled into and out during the phase noise analysis of an oscillator in accordance with some embodiments of the invention.

Referring now to FIG. 3, a block diagram of an oscillator phase noise analysis system 300 is illustrated. Input information and the output results resulting from a phase noise analysis of an oscillator circuit design in accordance with some embodiments of the invention. The system 330 includes a phase noise analyzer 330 for oscillator circuits. Operationally, the phase noise analyzer 330 performs the tasks of phase noise analysis as described by the method 200.

The phase noise analyzer 330 receives a circuit netlist 310 for an oscillator (oscillator circuit netlist 310). In addition to the netlist 310, the phase noise analyzer may also receive cell library information including circuit cell models; and netlist parasitic information. The netlist parasitic information may be in a number of different file formats such as a standard parasitic exchange format (SPEF), or other standard parasitic format (SPF), such as DSPF. The circuit netlist may be a netlist for a functional block, a full integrated circuit chip, or other hierarchical level thereof.

With these inputs, the phase noise analyzer 330 can generate the periodic transfer function matrix for the circuit netlist 310 at different frequencies and subsequently, compute the phase noise values at different offset frequencies. The computed phase noise output 340 may be graphically presented to a user on a monitor or printed out onto paper. The noise output 340 may be presented as the phase noise as illustrated by plot 100B or 100C or any variant thereof. It may also be summarized numerically by providing the numeric values of the phase noise and PPV of each selected offset frequency. In addition to the netlist 310, the phase noise analyzer 330 may also be provided with power supply information 320 to evaluate the phase noise performance of the oscillator circuit described by the netlist 310.

Figure 4:
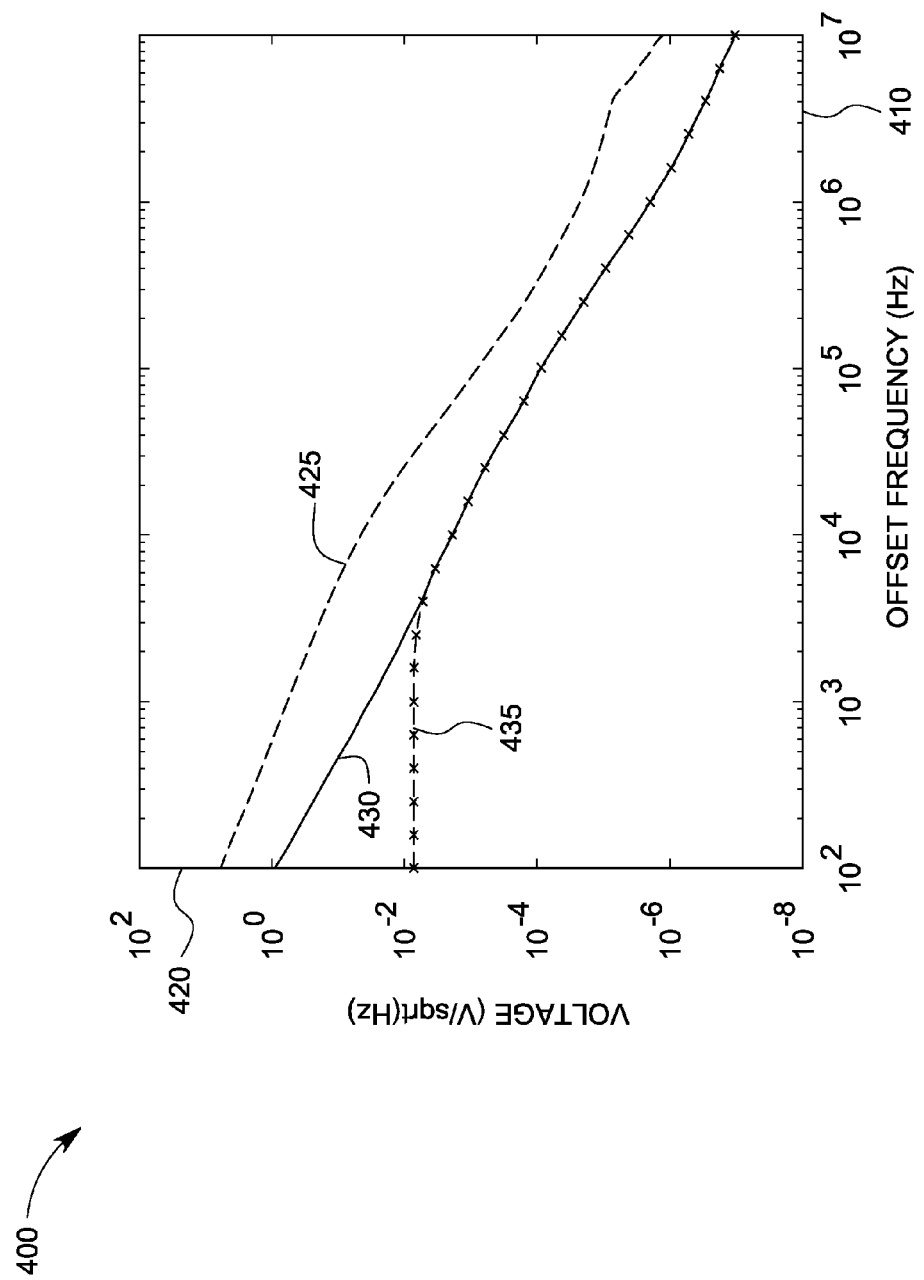
FIG. 4 illustrates exemplary phase noise waveforms of an oscillator generated by a convention PPV based noise analysis tool and the method performed by the embodiments of the invention.

Referring now to FIG. 4, plot 400 is an example graph of simulated values for the method in accordance with some embodiments of the invention. Exemplary noise waveforms 425, 430 and 435 are provided as a visualization of improvement in simulated values achievable with the method and system in accordance with some of the embodiments.

Plot 400 illustrates exemplary phase noise analysis waveforms 425 and 435 for an oscillator, generated by a conventional PPV based noise analysis tool and the method in accordance with the embodiments of the invention respectively. An oscillator circuit with large RC delay is simulated. Plot 400 represents an offset frequency 410 on a logarithmic scale along the x-axis and the signal power 420 (in Volts/sqrt(Hz) along the y-axis. Furthermore, a waveform 430 illustrates the reference phase noise present in the oscillator circuit. The phase noise reference waveform 430 may be generated by estimating the noise based on a simplified oscillator design or more accurate but computationally intensive phase noise analysis methods.

As shown, the phase noise waveform 425 overestimates the phase noise components in the oscillator circuit with a large RC delay. On the other hand, the phase noise waveform 435 closely follows the reference phase noise waveform 430. Thus, the simulated values illustrated by the phase noise waveform 435 shows considerable improvement over the simulated values represented by the phase noise waveform 425.

Electronic Computer Aided Design System

Figure 5:
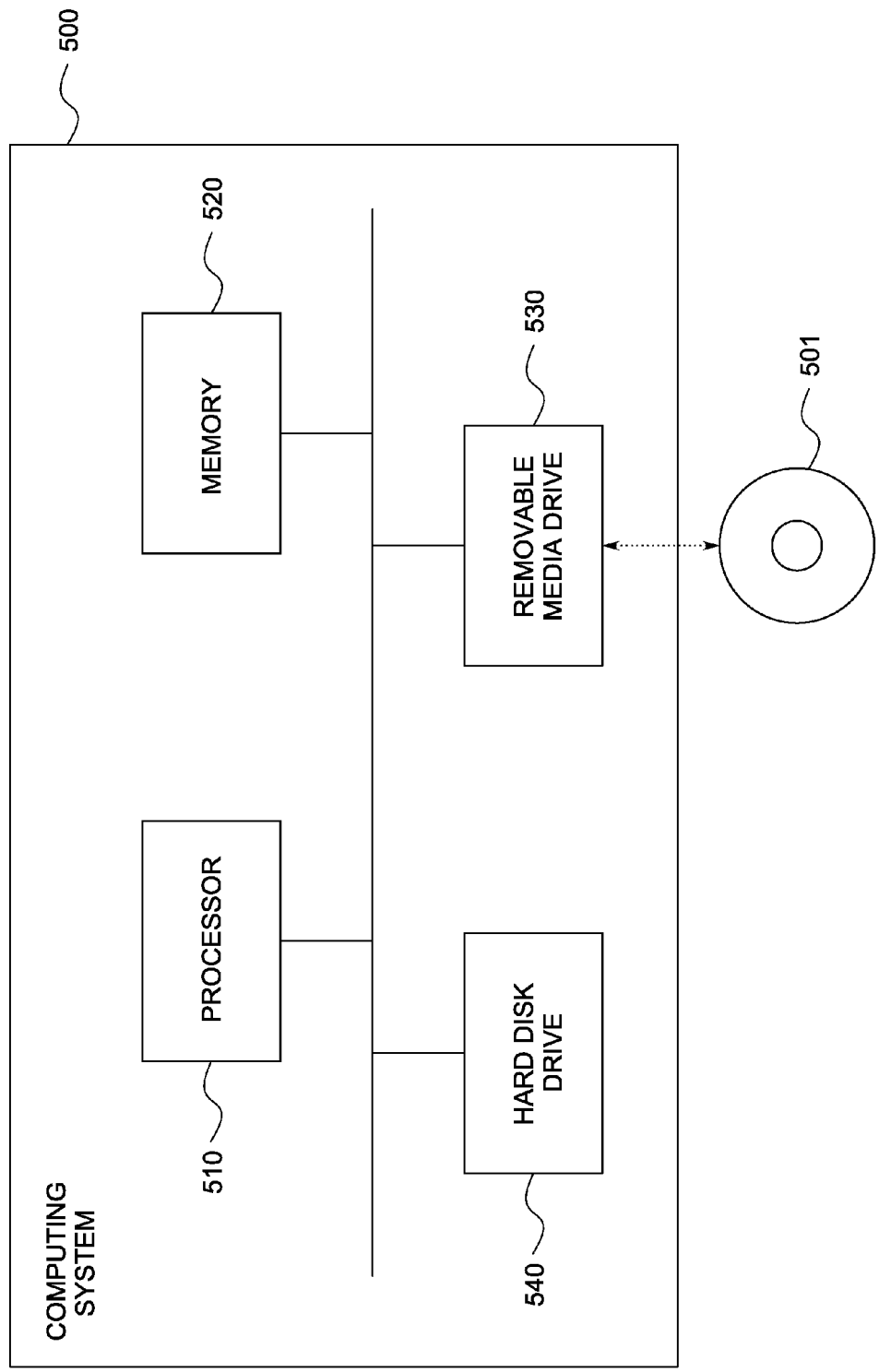
FIG. 5 illustrates an exemplary embodiment of a computing system that may be used with embodiments of the invention to form an electronic computer aided design system.

FIG. 5 illustrates an electronic computer aided design (ECAD) system 500 for analyzing designs of oscillator circuits. The ECAD system 500 may be used to perform some or all of the processes in accordance with a number of embodiments of the invention.

The computing system 500 includes a processor 510, a memory 520, a removable media drive 530, and a hard disk drive 540. In one embodiment, the processor 510 executes instructions residing on or stored in a machine-readable medium or storage device, such as the hard disk drive 540, a removable medium 501 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 520, which may include Random Access Memory (RAM), dynamic RAM (DRAM), etc. The processor 510 may retrieve the instructions from the memory 520 and execute the instructions to perform the operations described above.

Note that any or all of the components and the associated hardware illustrated in FIG. 5 may be used in various embodiments of the system 500. However, it should be appreciated that other configurations of the system 500 may include more or less devices than those shown in FIG. 5.

Hence, there has been provided a method and system for phase noise analysis particularly useful for the complex oscillator circuits. The method and system of the present invention avoids the problems of the conventional phase noise analysis tools by estimating the PPV as a function of frequency. By utilizing the estimated PPV, a method and system for more accurate phase noise analysis is provided.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result (design analysis results of an oscillator circuit design). The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relates to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the embodiments of the invention are not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

When implemented in software, the elements of the embodiments of the invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

CONCLUSION

The FW-PPV techniques of oscillator circuit analysis has a number of advantages. It provides a robust and accurate phase noise analysis. The matrix conditioning is improved for ill-conditioned oscillators, when the small signal frequency is incorporated. There is no need to implement complicated PPV extraction techniques for ill-conditioned oscillators (e.g., the hierarchical technique)—a plain periodic transfer function analysis can provide PPV extraction from the circuit netlist.

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. Rather, the embodiments of the invention should be construed according to the claims that follow below.

What is claimed is:

1. A method for phase noise analysis of oscillators, comprising:
   with a processor performing one or more of
      performing a steady state analysis on an oscillator by generating an augmented Jacobian matrix that includes a vector of phase condition;
      extracting a transfer function for frequency deviation at each node of the oscillator in response to a perturbation applied to each node, wherein the transfer function is extracted for a predetermined frequency range including oscillation frequency of the oscillator; and
      predicting phase noise of the oscillator based on the extracted transfer function for each node of the oscillator.

2. The method of claim 1, wherein performing steady state analysis includes
   reading a netlist for the oscillator;
   generating a set of nonlinear equations for the oscillator from the netlist,
   solving the set of nonlinear equations for a steady state solution; and
   linearizing the nonlinear equations on the steady state solution to form the augmented Jacobian matrix for extraction of a frequency aware perturbation projection vector (FW-PPV).

3. The method of claim 1, wherein extracting the transfer function includes
   generating a periodic transfer function matrix based on the augmented Jacobian matrix and a desired frequency offset from the oscillation frequency; and
   developing the transfer function by solving a linear system of equations, wherein the linear system of equations is constituted as a function of the periodic transfer function matrix and the extracted transfer function at each node.

4. The method of claim 3, wherein extracting the transfer function further includes
   repeating the generating of the periodic transfer function matrix and the developing of the transfer function for a plurality of desired frequency offsets within the predetermined frequency range.

5. The method of claim 3, wherein
   the periodic transfer function matrix is generated from the augmented Jacobian matrix of the oscillator at the desired frequency offset and phase equation for each node of the oscillator at the desired frequency offset.

6. The method of claim 3, wherein the generating of the periodic transfer function matrix further includes
   simplifying the periodic transfer function matrix by limiting the predetermined frequency range close to the oscillation frequency.

7. The method of claim 1, wherein the predicting the phase noise further includes
   generating a frequency dependent scalar function in response to the extracted transfer function; and
   computing the phase noise by applying a Lorentzian function to the frequency dependent scalar function.

8. The method of claim 7, wherein
   the Lorentzian function is computed by using a value of the frequency dependent scalar function at the desired frequency offset, wherein the value is a steady state solution obtained from the steady state analysis and the desired frequency offset.

9. The method of claim 7, wherein the predicting further includes
repeating the computing of the phase noise for a plurality of given frequency offsets within the predetermined frequency range.

10. The method of claim 1, further comprising:
generating a plot for the predicted phase noise of the oscillator.

11. The method of claim 1, further comprising:
evaluating design of the oscillator in response to the predicted phase noise.

12. A method for generating a frequency dependent perturbation projection vector for phase noise analysis of oscillators, the method comprising:
finding a steady state solution for an oscillator circuit design in response to a netlist of the oscillator circuit design, including generating an augmented Jacobian matrix with a vector of phase condition;
for a predetermined offset frequency from an oscillation frequency of the oscillator circuit design, generating a periodic transfer function analysis matrix for the oscillator circuit design from the augmented Jacobian matrix, wherein the offset frequency is within a predetermined frequency range including the oscillation frequency of the oscillator circuit design;
solving a system of linear equations to generate a frequency dependent perturbation projection vector, wherein the system of linear equations is a function of the periodic transfer function matrix and the frequency dependent perturbation projection vector at the predetermined offset frequency; and
wherein one or more of the finding, the generating, and the solving are performed with a processor.

13. The method of claim 12, further comprising:
repeating the generation of the periodic transfer function matrix and the solving of the system of linear equations for a plurality of predetermined offset frequencies within the predetermined frequency range.

14. The method of claim 12, wherein the generating of the periodic transfer function matrix further includes
simplifying the periodic transfer function matrix by limiting the predetermined frequency range close to the oscillation frequency.

15. A system for analyzing designs of oscillator circuits comprising:
a storage device to store instructions;
a processor to execute instructions; and
instructions stored in the storage device, the instructions executable by the processor to perform operations including
performing a steady state analysis on an oscillator circuit to generate an augmented Jacobian matrix that includes a vector of phase condition;
extracting a transfer function for frequency deviation at each node of the oscillator circuit in response to the augmented Jacobian matrix and a perturbation applied to each node, wherein the transfer function is extracted for a predetermined frequency range including an oscillation frequency of the oscillator circuit; and
predicting phase noise of the oscillator circuit for each node of the oscillator circuit on the basis of the extracted transfer function.

16. The system of claim 15, wherein
the steady state analysis operation performed by the processor executing the instructions includes the operations of
reading a netlist for the oscillator circuit;
generating a set of nonlinear equations for the oscillator circuit from the netlist; and
forming an augmented Jacobian matrix by linearizing the nonlinear equation on the steady state solution.

17. The system of claim 15, wherein
the extraction of the transfer function performed by the processor executing the instructions includes the operation of
generating a periodic transfer function matrix based on the augmented Jacobian matrix and the desired frequency offset; and
developing the transfer function by solving a linear system of equations wherein the linear system of equations is constituted as a function of the periodic transfer function matrix and the transfer function at each node.

18. The system of claim 17, wherein
the transfer function is extracted at a desired frequency offset from the oscillation frequency within the predetermined frequency range.

19. The system of claim 18, wherein
the generating of the periodic transfer function matrix and the developing of the transfer function is repeated for a plurality of desired frequency offsets within the predetermined frequency range.

20. The system of claim 17, wherein
the generation of the periodic transfer function matrix is simplified by limiting the predetermined frequency range to be near the oscillation frequency of the oscillator circuit.

21. The system of claim 15, wherein
the prediction of the phase noise of the oscillator circuit performed by the processor executing the instructions includes the operations of
generating a frequency dependent scalar function in response to the extracted transfer function; and
computing the phase noise by computing a Lorentzian function using the generated frequency dependent scalar function.

22. The system of claim 21, wherein
the Lorentzian function is computed by using a value of the frequency dependent scalar function at the desired frequency offset, a steady state solution obtained from the steady state analysis, and the desired frequency offset.

23. The system of claim 21, wherein
the processor repeatedly computes the phase noise for a plurality of given frequency offsets within the predetermined frequency range.

24. The system of claim 15, wherein
the instructions executable by the processor perform further operations including generating a plot for the predicted phase noise of the oscillator circuit.

25. The system of claim 15, wherein
the instructions executable by the processor perform further operations including
evaluating a design of the oscillator circuit in response to the predicted phase noise.

26. A machine readable product comprising:
a non-transitory machine readable medium having stored therein
machine readable program instructions to perform a steady state analysis on an oscillator circuit to generate an augmented Jacobian matrix that includes a vector of phase condition;
machine readable program instructions to extract a transfer function for frequency deviation at each node of the oscillator circuit in response to the augmented Jacobian matrix and a perturbation applied to each node, wherein the transfer function is extracted for a predetermined frequency range including an oscillation frequency of the oscillator circuit; and machine readable program instructions to predict phase noise of the oscillator circuit for each node of the oscillator circuit on the basis of the extracted transfer function.

27. The machine readable product of claim 26, wherein the machine readable program instructions to perform the steady state analysis includes machine readable program instructions to read a netlist for the oscillator circuit, machine readable program instructions to generate a set of nonlinear equations for the oscillator circuit from the netlist, and machine readable program instructions to form an augmented Jacobian matrix by linearizing the nonlinear equation on the steady state solution;

the machine readable program instructions to extract the transfer function includes machine readable program instructions to generate a periodic transfer function matrix based on the augmented Jacobian matrix and the desired frequency offset, and machine readable program instructions to develop the transfer function by solving a linear system of equations wherein the linear system of equations is constituted as a function of the periodic transfer function matrix and the transfer function at each node; and the machine readable program instructions to predict the phase noise of the oscillator circuit includes machine readable program instructions to generate a frequency dependent scalar function in response to the extracted transfer function, and machine readable program instructions to compute the phase noise by computing a Lorentzian function using the generated frequency dependent scalar function.

28. The machine readable product of claim 27, wherein the transfer function is extracted at a desired frequency offset from the oscillation frequency within the predetermined frequency range, and the machine readable program instructions to generate the periodic transfer function matrix and develop the transfer function is repeated for a plurality of desired frequency offsets within the predetermined frequency range.

29. The machine readable product of claim 27, wherein the machine readable program instructions to generate the periodic transfer function matrix is simplified by limiting the predetermined frequency range to be near the oscillation frequency of the oscillator circuit.

30. The machine readable product of claim 27, wherein the Lorentzian function is computed by using a value of the frequency dependent scalar function at the desired frequency offset, a steady state solution obtained from the steady state analysis, and the desired frequency offset.

31. The machine readable product of claim 26, wherein the phase noise is repeatedly computed for a plurality of given frequency offsets within the predetermined frequency range.

32. The machine readable product of claim 26, wherein the machine readable medium has further stored therein machine readable program instructions to generate a plot for the predicted phase noise of the oscillator circuit.

33. The machine readable product of claim 26, wherein the machine readable medium has further stored therein machine readable program instructions to evaluate a design of the oscillator circuit in response to the predicted phase noise.

\* \* \* \* \*